(12) United States Patent
Mendoza et al.

(10) Patent No.: US 10,613,908 B2
(45) Date of Patent: Apr. 7, 2020

(54) MANAGING HYDROCARBON ENERGY PRODUCTION WHILE PROACTIVELY MAINTAINING A BALANCED WORKLOAD

(71) Applicants: REPSOL, S. A., Madrid (ES); International Business Machines Corporation, Armonk, NY (US)

(72) Inventors: Pablo Enrique Vargas Mendoza, Madrid (ES); Jose Maria Segura Serra, Madrid (ES); Nubia Aurora Gonzalez Molano, Madrid (ES); Lashmikantha Mookanahallipatna Ramasesha, Madrid (ES); Roberto Federico Ausas, Sao Carlos (BR); Kamal C. Das, New Delhi (IN); Freddy Ernesto Mackay Espindola, Rio de Janeiro (BR); Ulisses Mello, Blauvelt, NY (US); Ankur Narang, New Delhi (IN); Carmen Nilda Mena Paz, Ipanema (BR); Eduardo Rocha Rodrigues, Sao Paulo (BR); Paula Aida Sesini, Copacabana (BR)

(73) Assignees: REPSOL, S.A., Madrid (ES); International Business Machines Corporation, Armonk, NY (US)

( * ) Notice: Subject to any disclaimer, the term of this patent is extended or adjusted under 35 U.S.C. 154(b) by 1018 days.

(21) Appl. No.: 14/944,310

(22) Filed: Nov. 18, 2015

(65) Prior Publication Data

US 2016/0306679 A1 Oct. 20, 2016

(30) Foreign Application Priority Data

Apr. 20, 2015 (EP) .................................. 15164270

(51) Int. Cl.
*G06F 9/50* (2006.01)
*G06F 17/50* (2006.01)
(Continued)

(52) U.S. Cl.
CPC ............ *G06F 9/5083* (2013.01); *G01V 99/00* (2013.01); *G01V 99/005* (2013.01);
(Continued)

(58) Field of Classification Search
CPC .... G01V 99/005; G01V 99/00; G06F 9/5083; G06F 9/5066; G06N 7/005
See application file for complete search history.

(56) References Cited

U.S. PATENT DOCUMENTS 6,292,822 B1  9/2001 Hardwick
9,187,984 B2 *  11/2015 Usadi .................. G06F 17/5018
(Continued)

FOREIGN PATENT DOCUMENTS

EP      2 896 469          9/2009
WO  WO 20121883887        1/2012
(Continued)

OTHER PUBLICATIONS

J M Gratien et al: "Scalability and Load-Balancing Problems in Parallel Reservoir Simulation", 2007 SPE Reservoir Symposium, Feb. 28, 2007.
(Continued)

*Primary Examiner* — Aniss Chad
(74) *Attorney, Agent, or Firm* — Law Office of Charles W. Peterson, Jr.; Louis J. Percello, Esq.; Joseph Petrokaitis, Esq.

(57) ABSTRACT

A system, method and program product for managing hydrocarbon energy production. A hydrocarbon field modeler models physical characteristics of a hydrocarbon energy field. A load predictor predicts processing workload in
(Continued)

modeling the hydrocarbon energy field, and identifying a balanced modeling unit distribution across multiple processors simulating field production. A load distribution unit distributes the modeling units across the processors for a balanced modeling unit distribution. The load predictor and load distribution unit proactively shifts loads to maintain workload balanced throughout the simulation.

20 Claims, 11 Drawing Sheets

(51) Int. Cl.
    *G06N 7/00*     (2006.01)
    *G01V 99/00*     (2009.01)
    *G06Q 50/02*     (2012.01)
    *G06Q 10/04*     (2012.01)

(52) U.S. Cl.
    CPC ......... *G06F 17/5009* (2013.01); *G06N 7/005* (2013.01); *G06Q 10/04* (2013.01); *G06Q 50/02* (2013.01)

(56) References Cited

U.S. PATENT DOCUMENTS

| | | |
|---|---|---|
| 2006/0036418 A1 | 2/2006 | Pita |
| 2013/0090907 A1 | 4/2013 | Maliassov |
| 2013/0118736 A1* | 5/2013 | Usadi ................. G06F 17/5018 166/268 |
| 2013/0311158 A1* | 11/2013 | Dasari ................. G01V 99/005 703/10 |
| 2013/0325419 A1 | 12/2013 | Al-Shaikh |
| 2014/0015841 A1 | 1/2014 | Killough |
| 2015/0205005 A1* | 7/2015 | Klie .................... G01V 99/005 703/2 |

FOREIGN PATENT DOCUMENTS

| | | |
|---|---|---|
| WO | WO 20121015516 | 2/2012 |
| WO | WO 20121082128 | 6/2012 |
| WO | WO 20131147875 | 10/2013 |

OTHER PUBLICATIONS

Aluru S et al: "Parallel domain decomposition and load balancing using space-filling curves", High-Performance Computing, 1997. Proceedings. Fourth International Conference on Bangalore, India Dec. 18-21, 1997, Los Alamitos, CA, USA,IEEE Comput. Soc, US, Dec. 18, 1997.

Xiaolin Li et al: "Hybrid Runtime Management of Space-Time Heterogeneity for Parallel Structured Adaptive Applications", IEEE Transactions on Parallel and Distributed Systems, IEEE Service Center, Los Alamitos, CA, US, vol. 18, No. 9, Sep. 1, 2007.

EPSR dated Jul. 8, 2015 for the EP counterpart to this application, Application No. 15164270.

\* cited by examiner

MANAGING HYDROCARBON ENERGY PRODUCTION WHILE PROACTIVELY MAINTAINING A BALANCED WORKLOAD

CROSS REFERENCE TO RELATED APPLICATION

The present application claims priority under 35 USC § 119 to European Patent Application No. EP15164270.9, "MANAGING HYDROCARBON ENERGY PRODUCTION WHILE PROACTIVELY MAINTAINING A BALANCED WORKLOAD" to Eduardo Rocha Rodrigues et al., filed Apr. 20, 2015 with the Spanish Patent Office, assigned to the assignees of the present invention and incorporated herein by reference.

BACKGROUND OF THE INVENTION

Field of the Invention

The present invention is related to managing hydrocarbon field production and more particularly to simulating hydrocarbon or petrochemical energy field production with the simulation balanced across multiple parallel processors simulating production.

Background Description

Efficiently extracting energy resources, e.g., oil or natural gas, from a hydrocarbon reservoir field requires a comprehensive development plan tailored for the field. The development plan provides production guidelines for a given planning horizon on a drilling schedule, selected to maximize field production for the reservoir. Arriving at a good comprehensive development plan requires accurate computer models modeling the reservoir. A reservoir development engineer extracts information from the model(s) for decision makers. Decision makers select the best development plan for economically committing available resources to achieve an optimum return. A typical large, world-class reservoir requires a significant and costly level of analysis, and consumes large amounts of computer time and resources.

Normally, state of the art field simulators model the entire reservoir for fluid characteristics, e.g., pore pressure and/or temperature, and for geomechanical characteristics. These field characteristics change throughout the course of reservoir production, as fluid properties change, and as geomechanical behavior evolves. For example, reservoir rock may compact abruptly; pores can partially or completely clog reducing flow; or pores can collapses all together. These changes can have a significant physical impact on reservoir production. Consequently, efficiently managing production requires modeling the reservoir for the duration of production. Typically there are wide range of production choices both for the initial analysis, and subsequently, for when standard business practices change or a major investment strategy changes.

Simulating a relatively large field is a large job, typically too large for most state of the art computers. Thus, to keep the computer resource load at a manageable level during field analysis, the simulation may be spread over multiple processors, e.g., parallel processors or, even on several independent cloud computers. With the simulation spread across multiple processors, each processor carries out some aspect, portion of the reservoir model to arrive at a geomechanical and fluidic response relatively quickly. However, any performance advantage from distributing a large simulation across multiple parallel processors can be lost when the load on one processor overburdens that processor, causing a bottleneck. Further, while at one point in the simulation, one processor may be experiencing a bottleneck, it may be that at some other point in the simulation, later or earlier, another processor may be experiencing a different bottleneck. Thus, it is important to identify these bottlenecks and shift loads to mitigate or avoid them where possible.

State of the art approaches use what is known as persistence to distribute simulation tasks amongst available processors. Persistence assumes that computational loads tend to persist over time, i.e., that recent past loads and bottlenecks predict near future loads and bottleneck requirements. However, this persistence assumption breaks down with highly dynamic simulation tasks. Geomechanics models in presence of fractures and for reservoir fluid models, persistence may not hold or, may apply only to very short periods. When persistence breaks down, state of the art models suffer from computational load imbalance, i.e., unexpected bottlenecks. Unfortunately, the dynamic nature of hydrocarbon reservoirs has limited scalability and the simulation size. These limits have both further increased simulation time, expended and additional resources, for diminishing return from increasing the number of parallel processors running the model.

Consequently, there is a need for better predictors of future reservoir simulation load; and more particularly, for optimally balancing processor load prospectively on an optimal number of processors running a reservoir model.

SUMMARY OF THE INVENTION

A feature of the invention is a proactively balanced workload, balanced across multiple processors;

Another feature of the invention is proactively balancing simulation workload across multiple processors simulating energy production in a hydrocarbon energy field;

Yet another feature of the invention is identification of future workload imbalances among parallel processors simulating energy production in a hydrocarbon energy field, and rebalancing workload prior to the occurrence of an imbalance to proactively balance simulation workload.

The present invention relates to a system, method and program product for managing hydrocarbon energy production. A hydrocarbon field modeler models physical characteristics of a hydrocarbon energy field. A load predictor predicts processing workload in modeling the hydrocarbon energy field, and identifies a balanced modeling unit distribution across multiple processors simulating field production. A load distribution unit distributes the modeling units across the processors for a balanced modeling unit distribution. The load predictor and load distribution unit proactively shifts loads to maintain workload balanced throughout the simulation.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
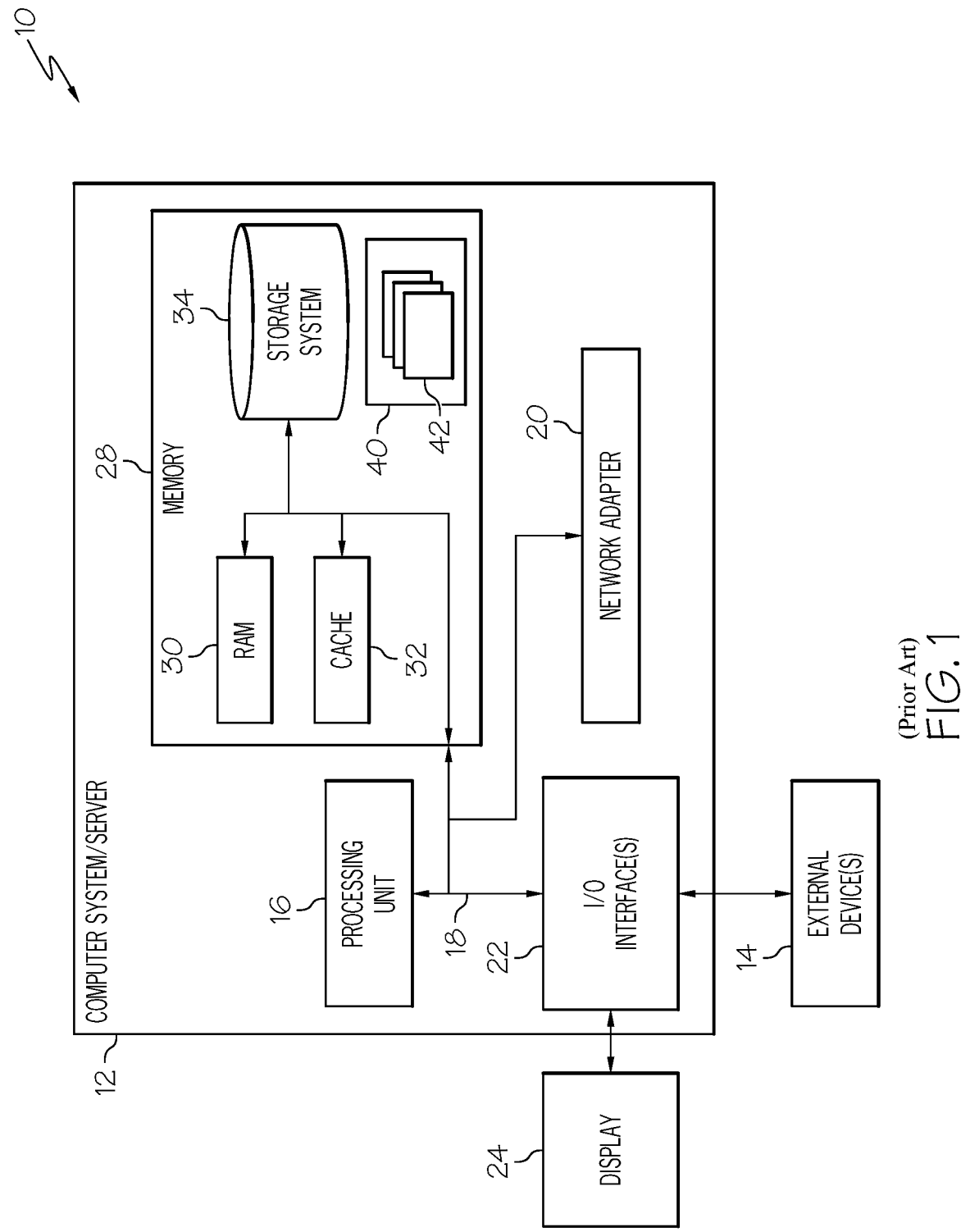
FIG. 1 depicts a cloud computing node according to an embodiment of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is further understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed and as further indicated hereinbelow.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
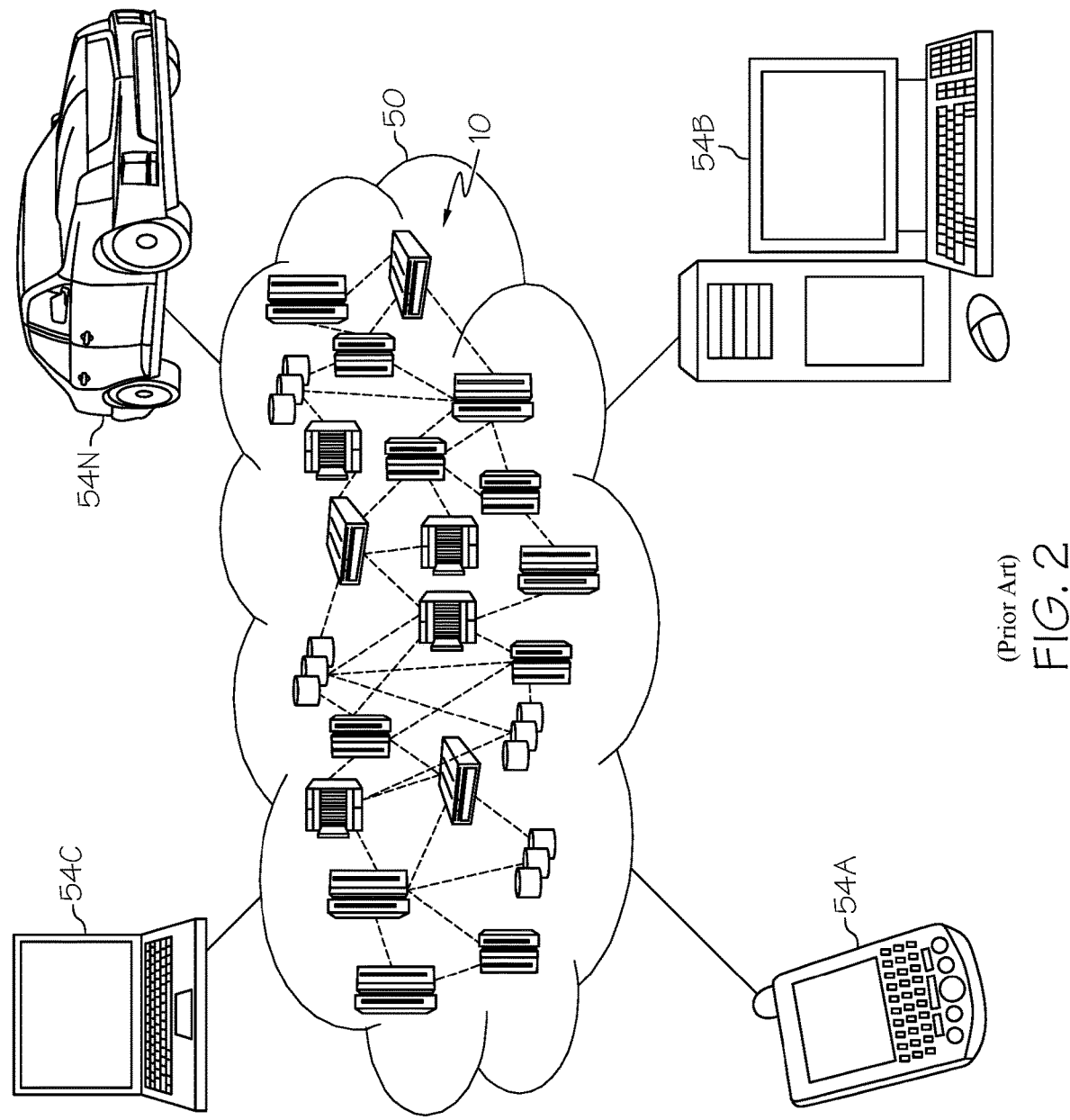
FIG. 2 depicts a cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
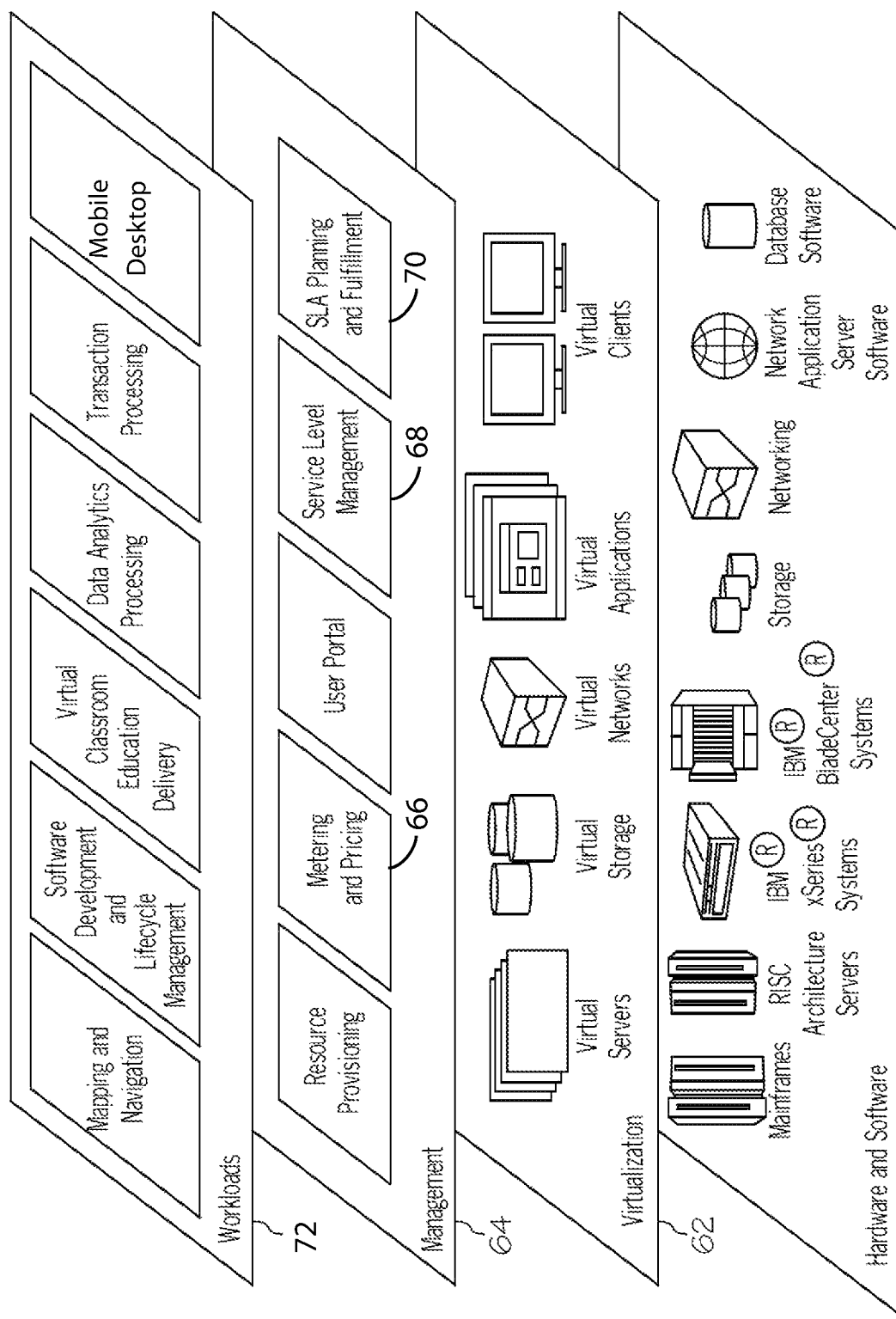
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Preferred, context aware resource provisioning provides dynamic procurement of computing resources and other resources that are utilized to perform tasks within the cloud computing environment. Metering and Pricing 66 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Preferred, context aware service level management 68 provides cloud computing resource allocation and management such that required service levels are met. Preferred, context-aware Service Level Agreement (SLA) planning and fulfillment 70 provide pre-arrangement for, and procurement of, cloud computing resources for which a future requirement is anticipated in accordance with an SLA.

Workloads layer 72 provides examples of functionality for which the cloud computing environment may be utilized. Examples of workloads and functions which may be provided from this layer include: mapping and navigation; software development and lifecycle management; virtual classroom education delivery; data analytics processing; transaction processing; and Mobile Desktops.

Figure 4:
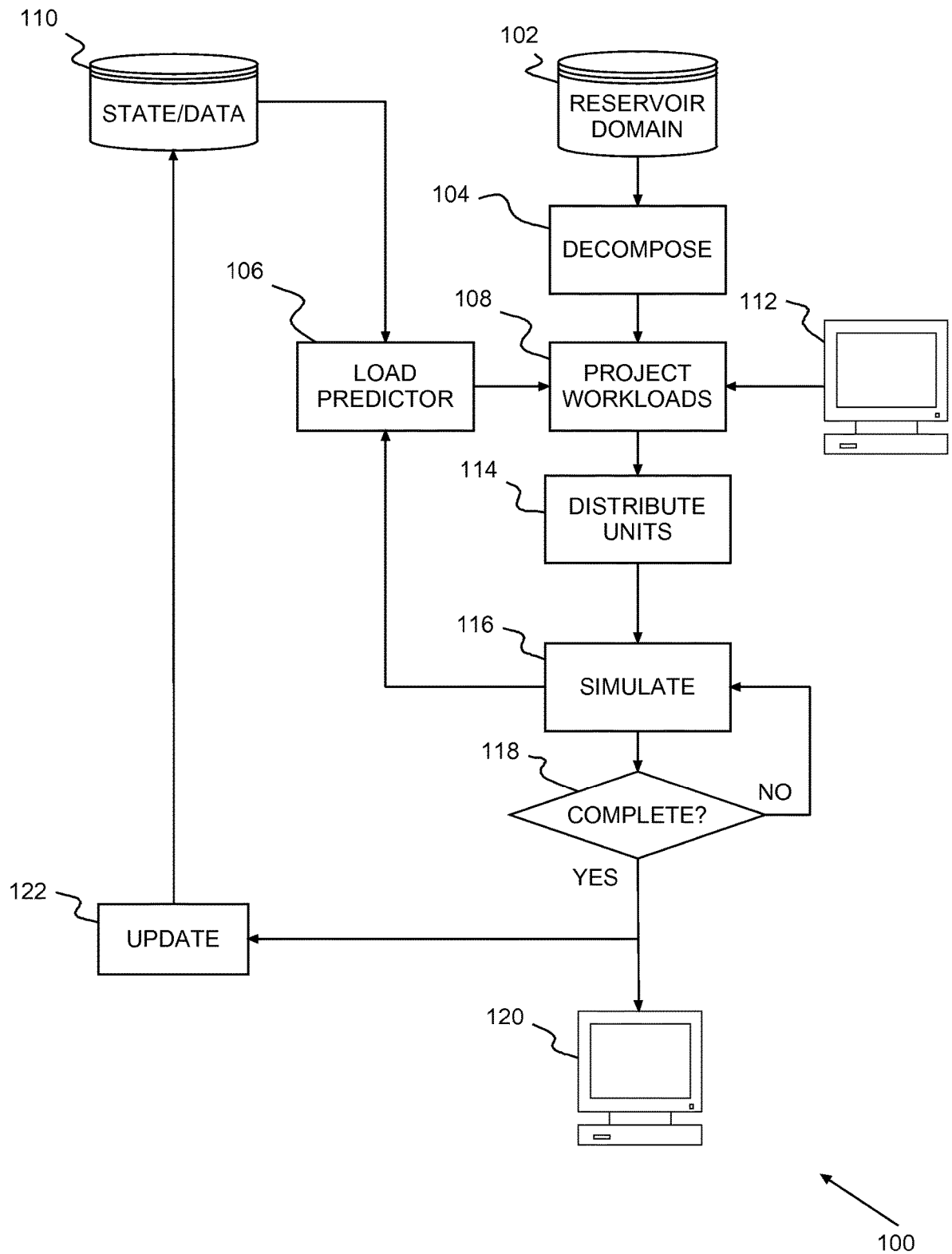
FIG. 4 shows an example of a load balancing geomechanical and fluidic simulations for a reservoir for modeling by multiple processors, according to a preferred embodiment of the present invention.

FIG. 4 shows an example of a load balancing 100 geomechanical and fluidic simulations for a reservoir 102 for modeling by multiple processors or processing units, e.g., 16 in FIG. 1, on one or more computers, e.g., 10 in FIGS. 1 and 2, according to a preferred embodiment of the present invention. Load balancing begins by a hydrocarbon field modeler segmenting or decomposing 104 the reservoir domain 102 for simulation. A load balancing predictor 106 estimates future work load 108 for each work unit segment, based on historical and current simulation state and results 110. Optionally, a user, e.g., a field engineer, may provide an initial estimate 112, or the system may automatically provide the initial estimate. After a load distribution unit distributes 114 the work units among the processors 16, the processors 16 simulate 116, iteratively, selectively rebalancing 118 until the simulation 116 is complete.

Initially, each processor may input a number of work units for parallel distribution 114. Once complete 118, the processors 16 display the results 120 and update 122 historic simulation state/data results 110. It should be noted that the hydrocarbon field modeler, load predictor and load distribution unit may be an independent computers 10 or processors 16 or on the same common computer 10.

Future work load estimates 108 may include, and indicate, how long each prediction is valid. The predictor 106 uses the estimates 108 to schedule the next load balancing iteration. Thus, until that iteration, simulation 116 is with the current distribution 114. Typical simulation state/data 110 includes, for example, stress, strain, pressure, well data and intervention activities. Optionally, a user can choose a predictor approach to estimate future loads 108, or the predictor 106 may select an approach automatically. Thus, the predictor 106 can use a heuristic, an optimization algorithm, or machine learning strategy, e.g., reinforcement learning, to automatically decide the best specific simulation distribution approach. Further, the processors 16 may simulate 116 iteratively for a given number of iterations, a given length of time or over a given time horizon.

Typically, a reservoir engineer models reservoir fluidically with a finite volume method (FVM) model, where the reservoir is segmented into an array or grid of "finite volumes" each surrounding a central node or centroid. The reservoir engineer models structural rock deformation geomechanically in a finite element method (FEM) model, where the typically, irregularly-shaped reservoir field is sub-divided into a mesh of smaller, more basic geometric elements, each of which may vary in size and shape, e.g., cubes, cones, and etc. Planners couple and correlate model results between the FEM and FVM models to estimate and extract production potential and economic performance. During simulation certain reservoir regions can plastify and fractures/faults can occur, e.g., from external events or from changes within the reservoir. These fractures/faults can change modeled reservoir properties, causing computational load imbalance among the processors modeling the reservoir, e.g., where migrating work units from one or more processors or processing units to one or more other processors may rebalance the load or lead to more balanced loads.

There are several static and dynamic sources that cause load imbalance in processors using these fluid and structural or geomechanical models to simulate a reservoir. Static sources are relatively easy to identify and predict, while dynamic sources, such as plastic region activation and fault activation, may be much more difficult. Activating plastic regions carries complex constitutive behavior. Fault activation can dramatically change flow and may stress the reservoir state. Further, these sources may evolve during simulation, dynamically varying the workload on individual processors to make planning a balanced load distribution more difficult.

Preferably, the preferred predictor 106 applies a preliminary balancing strategy to data 110 from, and the current state of, ongoing simulation 116 to predict potential imbalances from dynamic sources. As a preliminary balancing strategy the preferred predictor 106 may use lightweight models or a coarse prediction strategy, for example. Suitable such a preliminary balancing strategy may be based on, for example, machine learning, reduced order models (ROM), external events, mechanical failure prediction, and/or stress path prediction. The predictor 106 uses the prediction results to predict computational loads to determine an optimal workload distribution 114 for automatically rebalancing during ongoing, parallel simulation 116. Thus, the predictor 106 estimates future work load 108 on each processor or processing unit to predict dynamic source effects for proactively redistributing modeling loads for an optimal load redistribution.

For machine learning, the machine learning predictor 106 may train on prior simulation iterations until the training simulation results match historic simulation states and load imbalances. Subsequent to training the machine learning predictor 106 runs simultaneously with the simulation 116 or, optionally, in conjunction with a reduced-order model simulation. Typical suitable machine learning may include, for example, support vector machines (SVM), artificial neural nets (ANN), reinforcement learning, Markov models and Bayesian networks. The machine learning predictor 106 assigns future loads 114, work units, based on the simulation state 110. Thereafter, if training is used, the machine learning predictor 106 continuously trains itself.

Typical training parameters include, for example, application/frontend parameters and backend/control parameters. Examples of typical application/frontend parameters may include material strength parameters, e.g., yield strength, cohesion, angle of internal friction, and dilation angle; and rock-mass mechanical properties, e.g., Young's modulus, the Poisson ratio, the friction/dilation angle. Examples of typical and backend/control parameters may include any data moving between processing units. Further, the machine learning predictor 106 may use distributed machine learning with groups of processors or processing units 16 running machine learning and predicting future load imbalances and, further, control parameter values that facilitate a best or optimal load balance. In addition, the machine learning predictor 106 uses the predictions to select actions that minimize load migrations while achieving/maintaining load balance.

For a preliminary balancing strategy 108 based on reduced order models, the predictor 106 models, e.g., FEM and FVM models, the reservoir may use two different resolutions or granularities: a lighter model(s) with coarser and/or lighter granularity; and, the actual or production model(s) with a finer, production or planning level, granularity. The lighter model(s) require substantially less resources to complete in a fraction to the time required for the actual model(s) for a substantially reduced cost. Cardoso, "Development and application of reduced-order modeling procedures for reservoir simulation", PhD thesis, Stanford University, 2009, provides an example of proper orthogonal decomposition (POD) and trajectory piecewise linearization (TPWL) to reduce/simplify a production model. Proper orthogonal decomposition uses a full simulation to generate solution snapshots for reservoir pressure, saturation and stress states. These POD reservoir pressure and saturation states are subjected to a fluid solver, while simultaneously, subjecting the stress state to a geomechanics solver. The POD results are in the form of a data matrix. A singular value decomposition (SVD) applied to the resulting data matrix provides a reduced model for projecting a solution into a low-dimensional (the lighter model) subspace.

Figure 5:
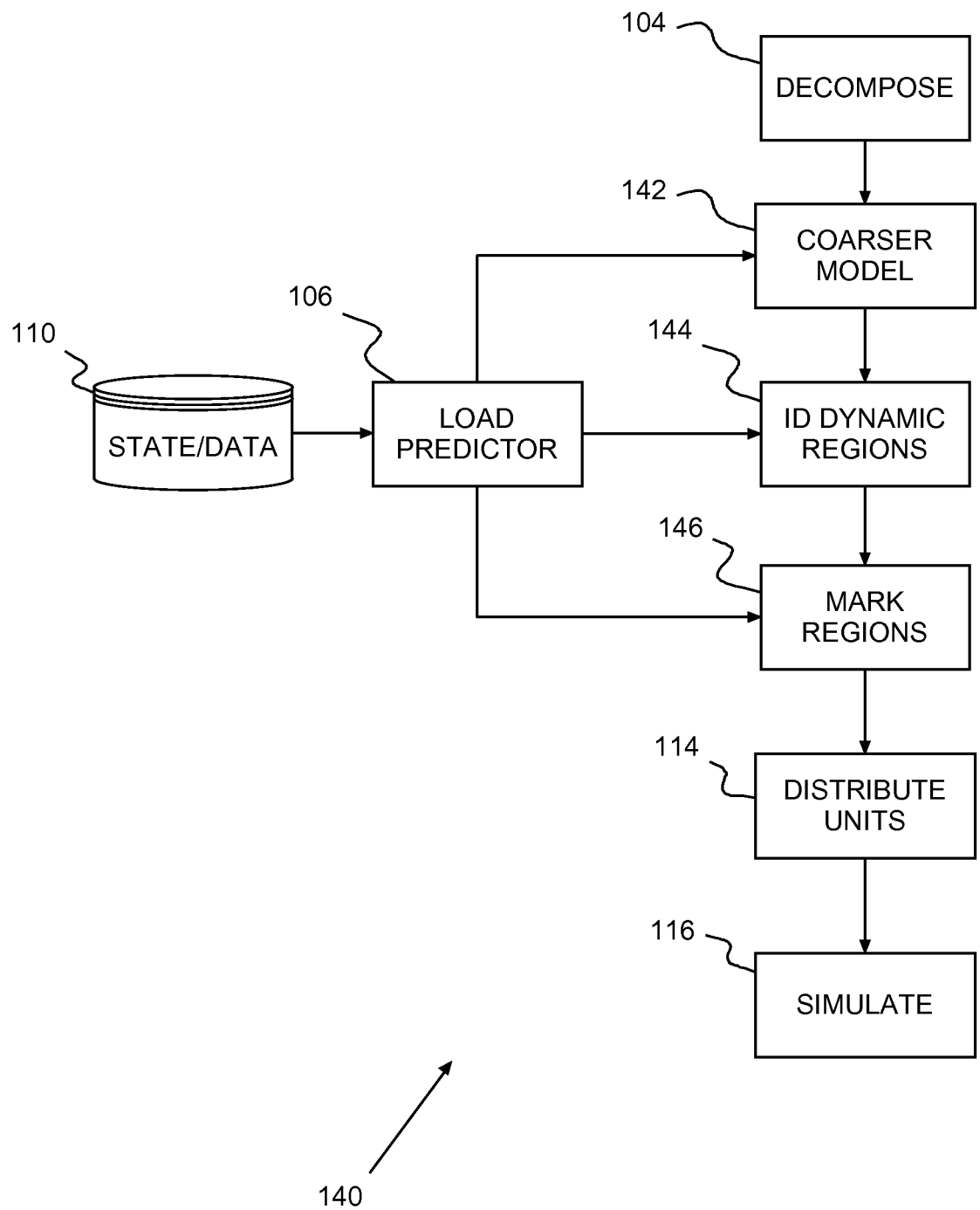
FIG. 5 shows an example of how the preferred predictor applies a lightweight model to predict future workload.

FIG. 5 shows an example of how the preferred predictor 106 applies a lightweight model 140 to predict future workload 108 with reference to FIG. 4 and with like steps labeled identically. After modeling the reservoir 102 the predictor 106 generates and uses a lightweight coarser model 142 to identify dynamic regions 144 in the simulation state/data 110 and, once identified, marks 146 those regions. Then, the predictor 106 indicates workload on each respective processor, e.g., by assigning a processor load weight to the each region/event. Rebalancing 114 with the weighted loads, simulation 116 continues. This predictive computational redistribution, which is proactive, persists for longer periods than balancing using prior persistence based approaches and, further, requires fewer rebalancing iterations.

Optionally, to significantly speedup balancing even more, a trajectory piecewise linearization (TPWL) merged with the ROM (discussed in more detail herein above) further projects the lightweight model into a low-dimensional space. The resulting linear expansions represent new pressure, saturation and stress states around the previously simulated POD states.

Figure 6:
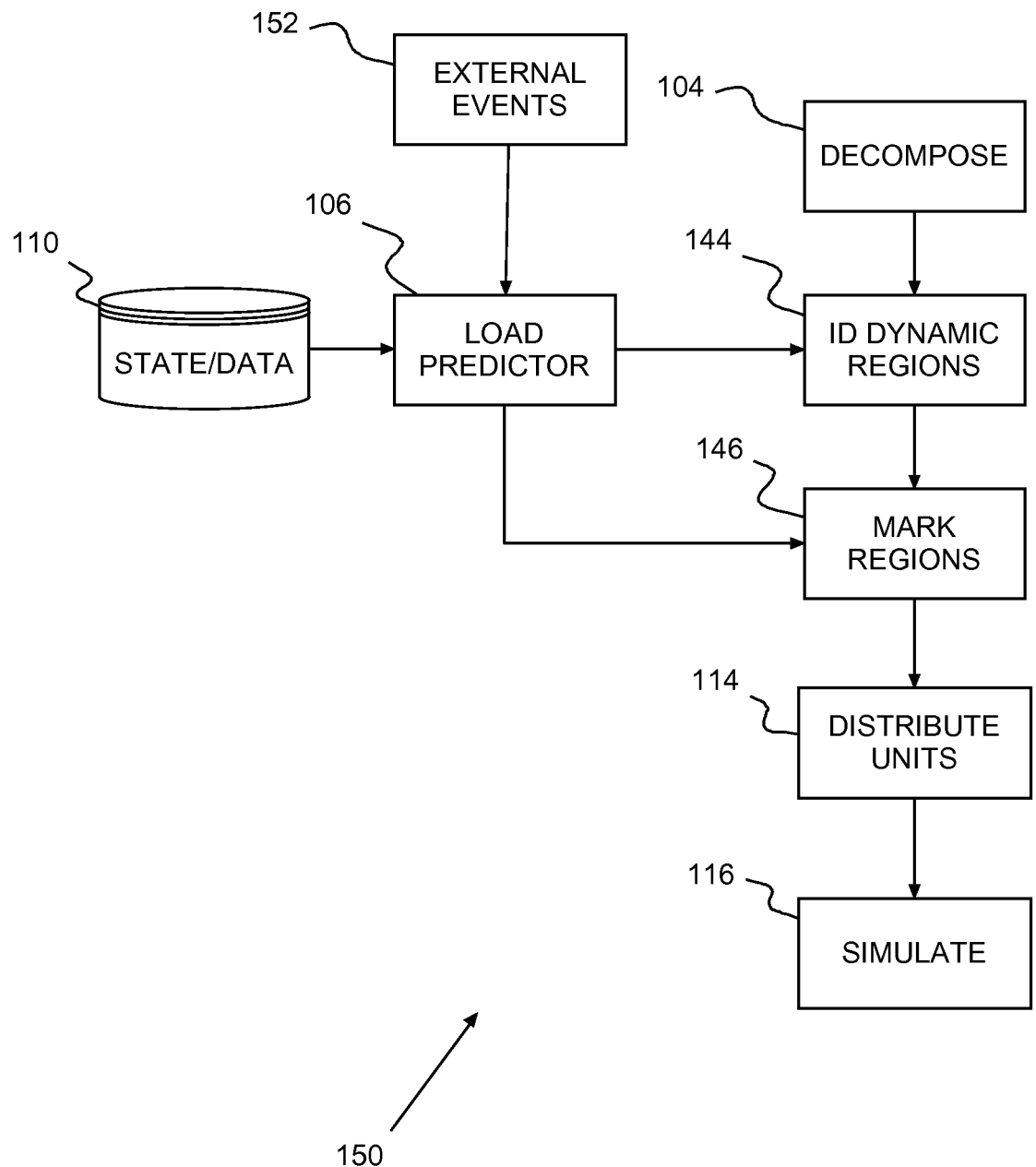
FIG. 6 shows an example of how the preferred predictor uses external events on the model to predict future workload.

FIG. 6 shows an example 150 of the preferred predictor 106 using external events 152 on the model 104 to predict future workloads 108 with like steps labeled identically. External events 152 are localized in space and time, and can produce dramatic state changes in simulation state/data 110. Examples of such external events can include new well installation, starting fluid injections, well casing failures and fault reactivation. The predictor 106 uses event spatial and temporal information to determine potential failure regions, i.e., identify dynamic regions 144 that may, consequently, carry more processor workload. The predictor 106 places markers 146 at each event and localizes each event in time and location in the simulation domain. The predictor 106 also determines the unit load from the constitutive models, weights each unit load and assigns work 114 accordingly for simulation 116.

Figure 7:
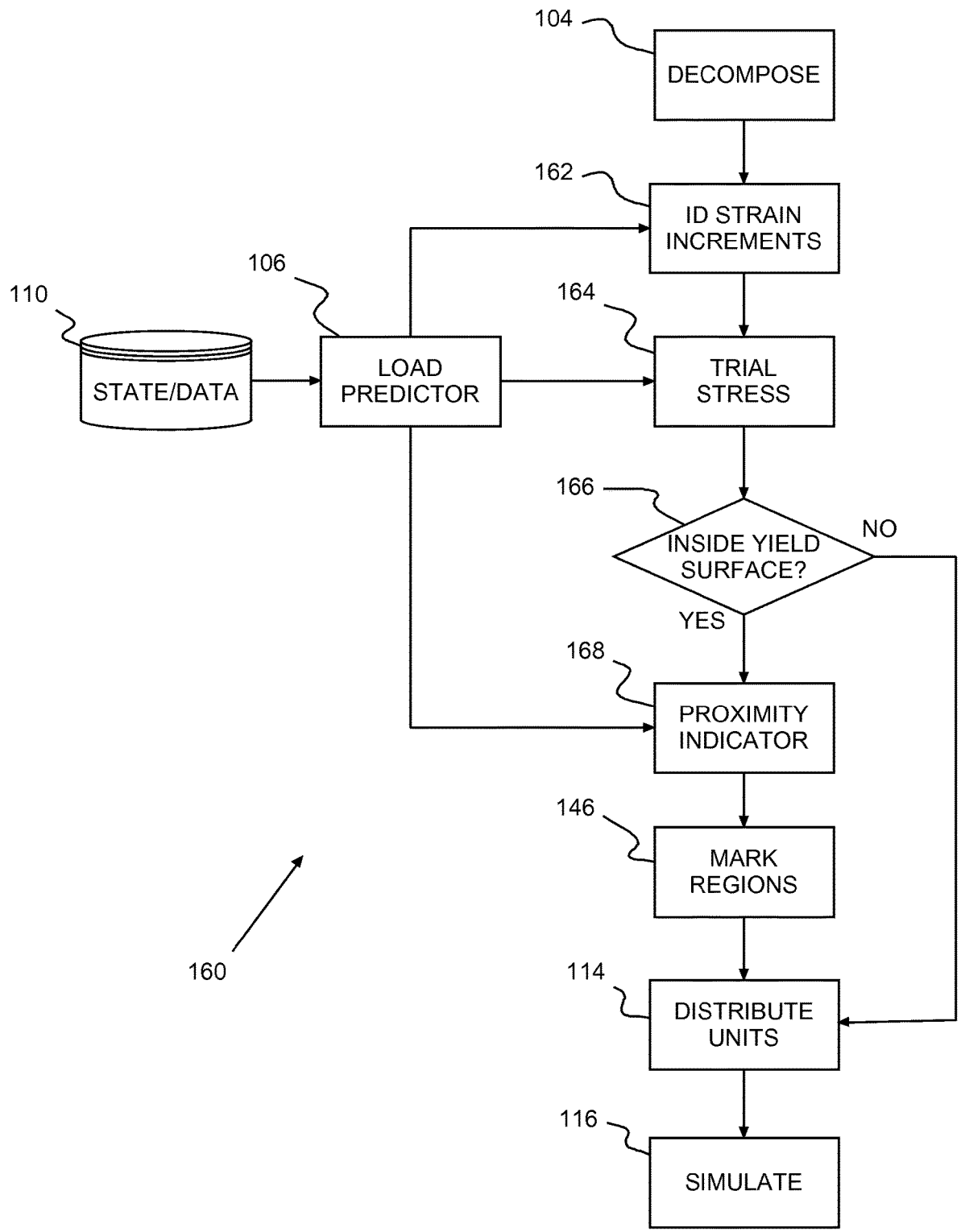
FIG. 7 shows an example of using mechanical failure prediction.

FIG. 7 shows an example of using mechanical failure prediction 160 to predict workload with substantially identical steps labeled identically. First, the preferred predictor 106 determines a strain increment 162 based on mechanical load or pore pressure changes applied to the model 104. The predictor 106 determines a trial stress 164 based on elasticity in simulation state/data 110, and determines if the trial stress falls inside the yield surface to a certain distance 166. If the trial stress crosses or falls outside of the yield surface, the simulation 116 generates a new load distribution. If the trial stress falls inside the yield surface, the predictor 106 defines a proximity indicator or marker 168. Then, the predictor 106 determines the derivative of the proximity indicator to identify regions that are likely to plastify and marks 146 the identified regions. Finally, the predictor 106 assigns 114 a processor load weight to the plastic regions for simulation 116. Preferably, each assigned 114 weight is a predefined value that is function of the actual constitutive model (both for the continuum and fractures). Further, the weight indicates work load on each processor load.

Figure 8:
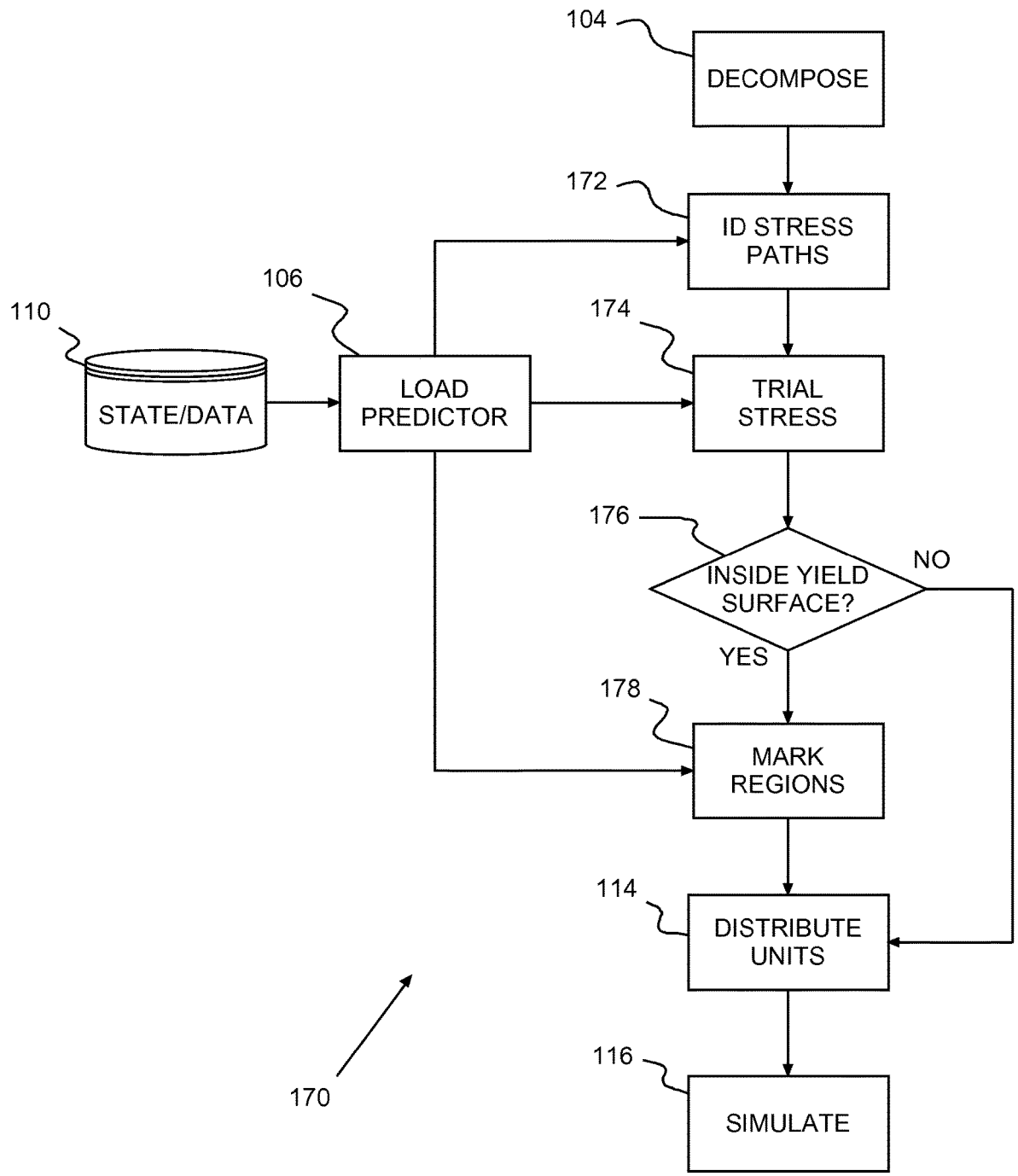
FIG. 8 shows an example of stress path prediction.
Figure 9A:
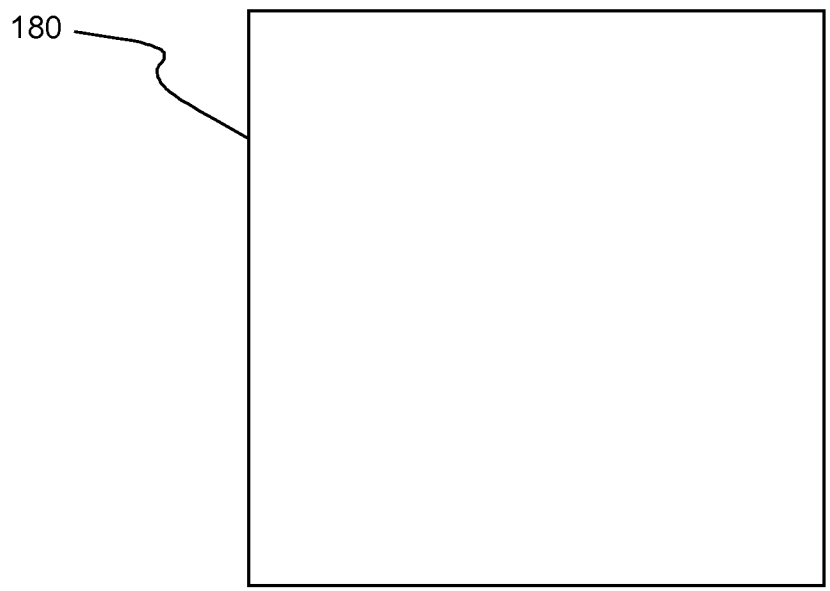
FIGS. 9A-F show application of preferred load balancing to a reservoir domain for simulation on 2 processors according to a preferred embodiment of the present invention.
Figure 9B:
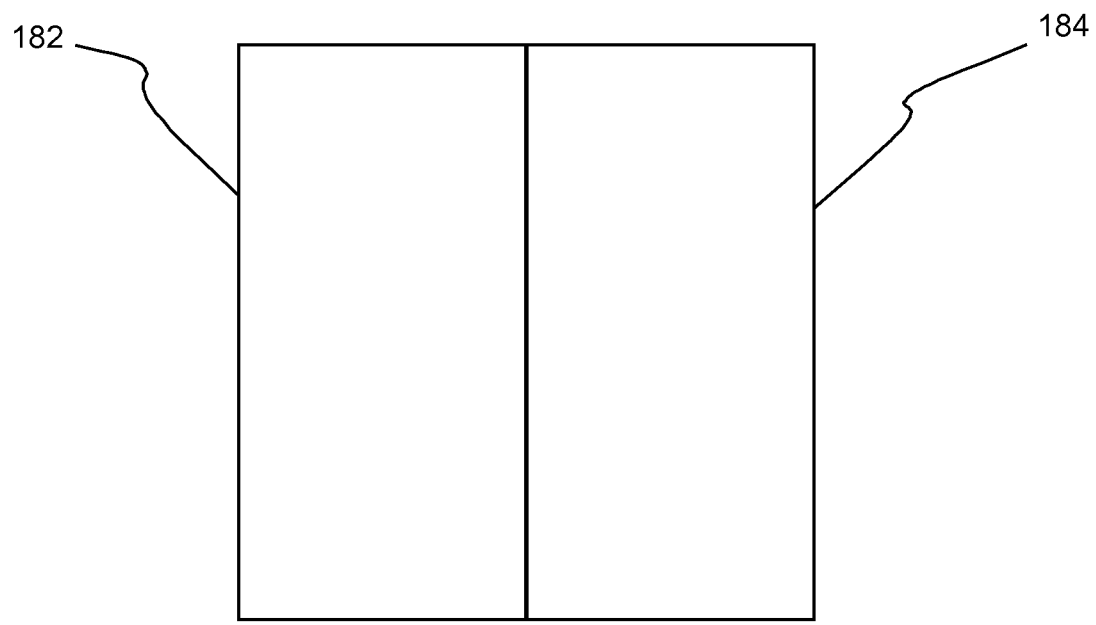
Figure 9C:
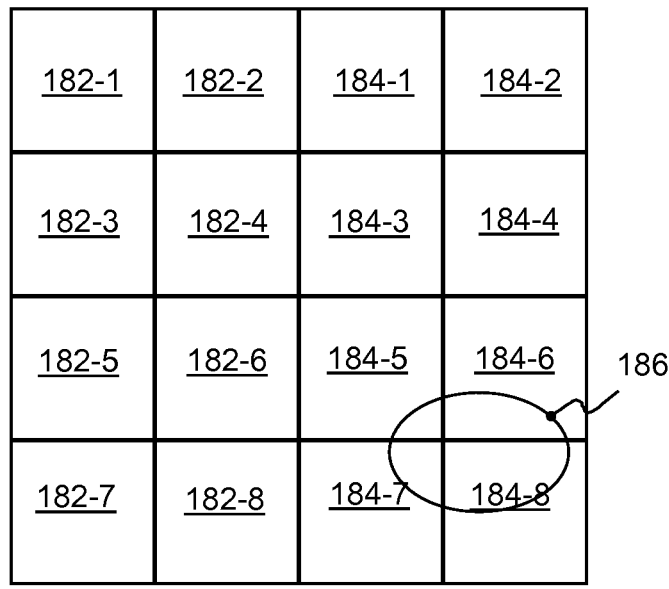
Figure 9D:
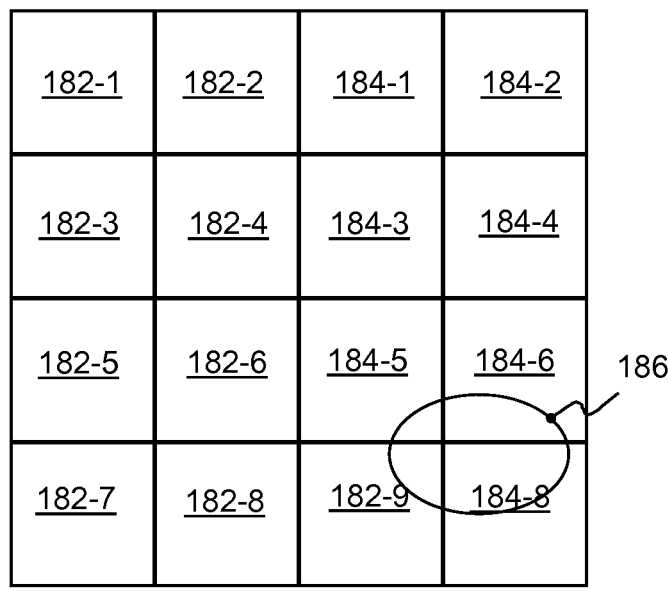
Figure 9E:
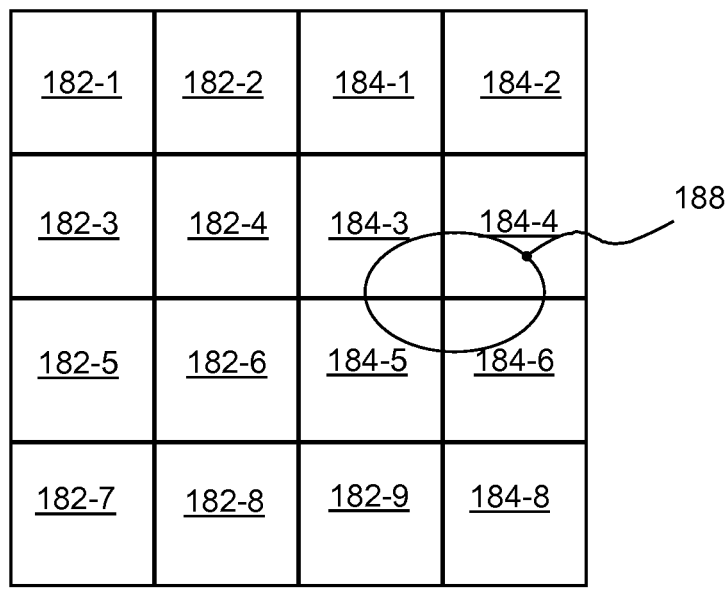
Figure 9F:
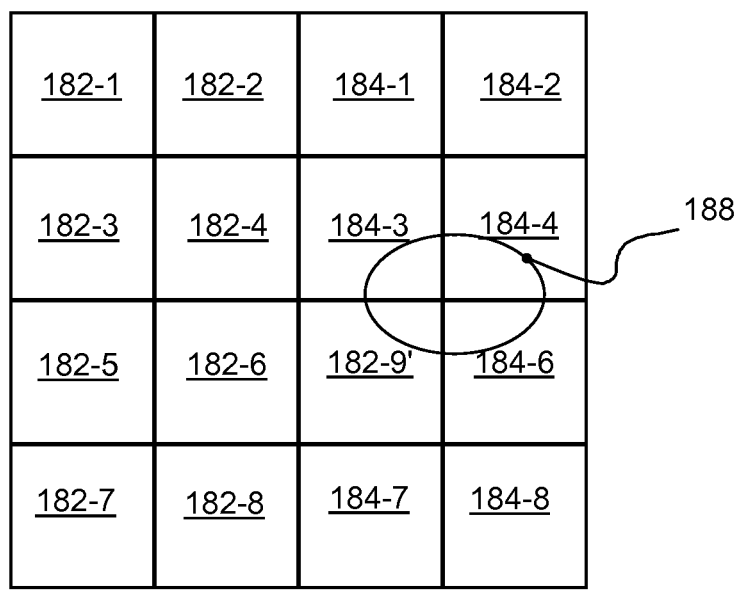

FIG. 8 shows an example of stress path prediction 170. The predictor 106 first identifies a stress path 172 based, for example, on simulation state/data 110, a previous stress path (e.g., from a prior pass), analytical expressions, or from well measurements. Then, the predictor 106 estimates a trial stress 174 based on stress path 172. In estimating trial stress 174, the predictor 106 selects a stress change value based, for example, on a previous stress value or equal to pore pressure change. Next, the predictor 106 determines whether the trial stress falls inside the yield surface to a certain distance 176. If the trial stress crosses or falls outside of the yield surface, the simulation 116 determines a new load distribution. If the trial stress falls inside the yield surface, the predictor 106 defines a proximity indicator and marks regions 178 that are likely to plastify. Finally, the predictor 106 assigns a processor load weight 114 to each of the plastic regions for simulation 116. Preferably again, each assigned 114 weight is a predefined value that is function of the actual constitutive model (both for the continuum and fractures). Likewise, the weight determines each processor load weight, indicating processor work load. In a further embodiment, the predictor 106 assigns a processor load weight 114 to each region that is marked as regions that are likely to plastify.

FIGS. 9A-F show application of preferred load balancing (100 in FIG. 4) to a reservoir domain 180 over a hydrocarbon energy field for simulation on 2 processors, a first processor and a second processor, according to a preferred embodiment of the present invention. First, the reservoir domain is decomposed/divided 102 into 2 regions (each one assigned to one processor in this example) 182, 184 and subdivided into eight (8) equal work units 182-1, 182-2, 182-3, 182-4, 182-5, 182-6, 182-7, 182-8, and 184-1, 184-2, 184-3, 184-4, 184-5, 184-6, 184-7, 184-8 of equal work load (8 workload units on each processor). When an event 186 doubles the workload for work units 184-5, 184-6, 184-7, 184-8, a workload imbalance occurs, loading one processor, the first processor computing over the first region 182, with 8 workload units and the other, the second processor computing over the second region 184, with 12 workload units.

Previously, the workload could have been rebalanced by reassigning work unit 184-7, which has a historically higher occurrence of such problems, to the other processor, the first processor, as unit 182-9. After rebalancing each processor has 10 work units assigned. In this example however, when the event migrates to 188 (FIG. 9E) instead of 186, doubles the workload for units 184-3, 184-4, 184-5, 184-6, a workload imbalance reoccurs, now loading the first processor with 9 workload units and the second processor with 11 workload units. Also in this example, event 188 does not double the workload for work unit 184-7. By contrast, the preferred predictor 106 predicts the shift to 188, and so instead, rebalances by reassigning work unit 184-5, to the second processor as unit 182-9' and work unit 184-7 to the same second processor as before the first rebalance. Again each processor has 10 work units assigned for imbalance 186. However, when the imbalance shifts to 188, the workloads remain balanced. According to this embodiment, work units 184-7 and 184-5 have been selected for rebalancing among the four work units influenced by imbalances 186 and 188 as they are adjacent to the region 182 assigned to the other processor. A further criterion for selecting work units 184-7 and 184-5 depends on the direction of displacement of the imbalance 186 wherein said work units 184-7 and 184-5 are chosen as they are in the opposite side to the forward direction of the imbalance 186-188.

Thus advantageously, load balancing 100 according to the present invention is predictive, using physical knowledge of the processes involved (e.g., potential failures) to proactively predict dynamic sources for redistributing modeling loads optimally to limit rebalancing. Thus, such an optimally chosen load distribution anticipate load shifts without waiting for load imbalances to occur. Because the present invention uses a lightweight model to simulate data from underlying physics in order to identify regions that are likely to become imbalanced; the balanced load remains well balanced for a longer time period as compared prior approaches, e.g., approaches that balanced loads purely based on past measurements, such as for the persistence approach. The preferred prediction strategy, based on current simulation state/data, predicts loads either heuristically or based on a lightweight estimator model or strategy. Heuristically, load balancing 100 examines the current state of the simulation and estimates how the load will evolve. The lightweight model or strategy reduces initial simulation to identify areas for balancing, e.g., executing a simplified model or simulating at triggering events.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for managing hydrocarbon energy production, said system comprising:
    a hydrocarbon field modeler modeling physical characteristics of a hydrocarbon energy field and segmenting the model into a plurality of modeling units;
    a plurality of processors;
    a load predictor predicting processing workload in modeling said hydrocarbon energy field, said load predictor identifying a balanced distribution of said modeling units across said plurality of processors; and
    a load distribution unit distributing modeling units across said plurality of processors responsive to said balanced distribution, said plurality of processors modeling said hydrocarbon energy field, said load predictor further monitoring modeling for identified potential load changes and predicting failures identified by yield surface trial stress until said production simulation is complete, and
    whenever said load predictor predicts the load distribution will become unbalanced, said load distribution unit re-distributes said modeling units across said plurality of processors, wherein predicting failures predicts failures likely to occur in said reservoir by selectively weighting regions likely to plastify during production, the workload being selectively redistributed to said plurality of work units responsive to said weighted regions, and wherein wells are drilled and field production is adjusted to extract field resources from said hydrocarbon energy field responsive to modeled said physical characteristics.

2. A system as in claim 1, said system further comprising a simulation state/data store, said plurality of processors storing ongoing simulation states/data in said simulation state/data store, said load predictor identifying field model locations likely to be the source of imbalances from increased workload in one or more modeling units.

3. A system as in claim 2, wherein said load predictor identifies a modeling unit re-distribution whenever said identified model locations indicate that shifting at least one modeling unit from one of said plurality of processors to another maintains a more balanced distribution.

4. A system as in claim 2, wherein said hydrocarbon field modeler models said hydrocarbon field at a first resolution, said load predictor modeling said hydrocarbon field in a reduced model at a second resolution, said second resolution being coarser than said first resolution, said load predictor predicting workload imbalances among said plurality of processors from said reduced model, and identifying from said reduced model when shifting at least one modeling unit from one of said plurality of processors to another rebalances simulating the first resolution model.

5. A system as in claim 2, wherein said load predictor is a machine learning predictor identifying workload imbalances among said plurality of processors, said load predictor identifying when shifting at least one modeling unit from one of said plurality of processors to another will rebalance load distribution.

6. A system as in claim 2, wherein predicting failures comprises said load predictor predicting mechanical failures identified by yield surface trial stress from strain increments and identifies whether the mechanical failures will cause workload imbalances among said plurality of processors, said load predictor identifying when shifting at least one modeling unit from one of said plurality of processors to another will rebalance load distribution.

7. A system as in claim 2, wherein predicting failures comprises said load predictor predicting stress path failures identified by yield surface trial stress from stress path and identifies whether the stress path failures will cause workload imbalances among said plurality of processors, said load predictor identifying when shifting at least one modeling unit from one of said plurality of processors to another will rebalance load distribution.

8. A system as in claim 1, wherein said system comprises one or more cloud computers, said plurality of processors being in at least one of said or more cloud computers.

9. A method of managing hydrocarbon energy production, said method comprising:
- decomposing a reservoir domain, the decomposed reservoir domain modeling the reservoir as a plurality of work units;
- projecting workload for simulating each of said plurality of work units;
- distributing said plurality of work units across a plurality of processors to balance workload amongst said plurality of processors;
- simulating energy production in the reservoir model; and
- monitoring simulation comprising projecting workload on said plurality of processors and whenever the projected workload indicates an imbalance in the current distribution, redistributing said plurality of work units across said plurality of processors to rebalance load, wherein projecting workload predicts failures likely to occur in said reservoir by selectively weighting regions likely to plastify during production, the workload being selectively redistributed to said plurality of work units responsive to said weighted regions; and when said simulation is complete
- drilling wells and adjusting field production to extract field resources from said hydrocarbon energy field responsive to the simulated energy production.

10. A method as in claim 9, wherein projecting workload comprises applying machine learning to the reservoir model, said machine learning identifying simulation conditions indicating that said imbalance is projected for the current distribution.

11. A method as in claim 9, wherein projecting workload comprises:
- identifying external events from simulation state and data for the reservoir model; and
- determining whether each identified external event will cause said imbalance is projected for the current distribution.

12. A method as in claim 9, wherein the reservoir model from decomposing said reservoir domain has a first resolution with a first plurality of work units, and projecting workload comprises:
- modeling said reservoir domain in a lightweight model with a second resolution coarser than said first resolution, and having a second plurality of work units, fewer than said first plurality of work units;
- simulating said lightweight model; and
- identifying dynamic regions in said lightweight model, indicated said dynamic regions identifying when and where load imbalances will occur in said reservoir model during simulation.

13. A method as in claim 9, wherein predicting failures predicts mechanical failures, predicting mechanical failures comprising:
- determining a strain increment from applied mechanical load and pore pressure changes;
- defining a proximity indicator whenever elasticity causes a trial stress;
- determining the derivative of said proximity indicator;
- marking any regions indicted as likely to plastify by said derivative and said proximity indicator; and
- weighting each marked region, the weight being used to redistribute said plurality of work units.

14. A method as in claim 9, wherein predicting failures predicts stress paths, predicting stress paths comprising:
- determining a stress path;
- defining a proximity indicator whenever said stress path includes a trial stress;
- determining the derivative of said proximity indicator;
- marking any regions indicted as likely to plastify by said derivative and said proximity indicator; and
- weighting each marked region, the weight being used to redistribute said plurality of work units.

15. A computer program product for managing hydrocarbon field production, said computer program product comprising a non-transient computer usable medium having computer readable program code stored thereon, said computer readable program code causing one or more computers executing said code to:
- decompose a reservoir domain to model the reservoir as a plurality of work units, said reservoir being a hydrocarbon reservoir in a hydrocarbon field, energy resources being recovered from said hydrocarbon field;
- project workload for simulating each of said plurality of work units, wherein projecting workload predicts failures likely to occur in said reservoir by selectively weighting regions likely to plastify during production;
- distribute said plurality of work units across a plurality of processors to balance workload amongst said plurality of processors, the workload distribution across the processors being the current distribution;
- simulate energy production in the modeled reservoir to locate and schedule drilling reservoir wells and to control reservoir production, wherein simulation comprises:
  - simulating production with the current distribution, and while simulating
  - monitoring simulation for an indication of an expected imbalance in the current distribution caused by reservoir changes, and when an expected imbalance is identified
- re-projecting workload to redistribute said plurality of work units across said plurality of processors to maintain balance, the workload being selectively redistributed to said plurality of work units responsive to said weighted regions, the workload re-distribution across the processors being the current distribution, wherein wells are drilled and field production is adjusted to extract field resources from said hydrocarbon energy field responsive to the re-projected workload.

16. A computer program product for managing hydrocarbon field production as in claim 15, wherein said computer readable program code causing computers executing said code to project and re-project workload causes computers executing said code to apply machine learning to the reservoir model, said machine learning identifying simulation conditions indicating each workload imbalance projected for said current distribution.

17. A computer program product for managing hydrocarbon field production as in claim 15, said computer readable program code causing computers executing said code to project and re-project workload causes computers executing said code to:
- identify external production events from simulation state and data for the reservoir model; and
- determine whether each identified external production event will cause said imbalance for the current distribution.

18. A computer program product for managing hydrocarbon field production as in claim 15, wherein the reservoir model from decomposing said reservoir domain has a first resolution with a first plurality of work units, and said computer readable program code causing computers executing said code to project and re-project workload causes computers executing said code to:

model said reservoir in a lightweight model with a second resolution coarser than said first resolution, and having a second plurality of work units, fewer than said first plurality of work units;

simulate production with said lightweight model; and identify dynamic regions in said lightweight model, said dynamic regions identifying when and where imbalances will occur in said reservoir model.

19. A computer program product for managing hydrocarbon field production as in claim 15, said computer readable program code causing computers executing said code to project and re-project workload comprises causes computers executing said code to predict failures to predict mechanical failures, predicting mechanical failures comprising:

determining a strain increment from applied mechanical load to, and pore pressure changes in, said reservoir;

defining a proximity indicator whenever elasticity causes a trial stress;

determining the derivative of said proximity indicator;

marking any regions in said reservoir indicted as likely to plastify by said derivative and said proximity indicator; and weighting each marked region, the weight being used to redistribute said plurality of work units.

20. A computer program product for managing hydrocarbon field production as in claim 15, said computer readable program code causing computers executing said code to project and re-project workload causes computers executing said code to predict failures to predict stress paths, predicting stress paths comprising:

determining a stress path;

defining a proximity indicator whenever said stress path a trial stress;

determining the derivative of said proximity indicator;

marking any regions in said reservoir indicted as likely to plastify by said derivative and said proximity indicator; and weighting each marked region, the weight being used to redistribute said plurality of work units.

* * * * *